United States Patent [19]
Yu et al.

[11] Patent Number: 6,164,990
[45] Date of Patent: Dec. 26, 2000

[54] PICK-UP FOR ELECTRONIC CARD CONNECTOR

[75] Inventors: Hung-Chi Yu, His-Chih; Shun-Chi Tung, Tu-Chen, both of Taiwan

[73] Assignee: Hon Hai Precision Ind. Co., Ltd., Taipei Hsien, Taiwan

[21] Appl. No.: 09/328,760

[22] Filed: Jun. 9, 1999

[30] Foreign Application Priority Data

Nov. 6, 1998 [TW] Taiwan ................................ 87218445

[51] Int. Cl.⁷ ................................................. H01R 13/44
[52] U.S. Cl. .......................... 439/135; 439/940; 439/353
[58] Field of Search .................................... 439/135, 353, 439/357, 377, 940

[56] References Cited

U.S. PATENT DOCUMENTS 6,015,305  1/2000  McHugh et al. ........................ 439/135
6,056,579  5/2000  Richards, III et al. .................. 439/358

*Primary Examiner*—Khiem Nguyen
*Attorney, Agent, or Firm*—Wei Te Chung

[57] ABSTRACT

A pick-up is adapted to be fit into an electronic card connector for allowing the connector to be picked up by an external device. The pick-up includes a flat body receivable between two spaced retention bars of the connector. The flat body has two lateral edges and a flat face extending therebetween. Each lateral edge is receivable in a guide slot defined in the corresponding retention bar for retaining the flat body in the connector with the flat face exposed for engagement by the external device. The pick-up further includes a retainer mounted on each lateral edge thereof. Each retainer includes at least one cantilevered arm having a first end fixed to the lateral edge of the flat body and a free second end spaced from the lateral edge and forming a contact engagement member thereon. The contact engagement member is thus resiliently supported on the lateral edge for engaging with the guide slot to secure the pick-up in the connector.

3 Claims, 4 Drawing Sheets

PICK-UP FOR ELECTRONIC CARD CONNECTOR

BACKGROUND OF THE INVENTION

1. Field of the Invention

The present invention generally relates to an electronic card connector, such as a PCMCIA connector, and in particular to a pick-up for being temporarily inserted into a connector for allowing the connector to be picked up.

2. The Prior Art

Automation has been promoted in all industries for reducing manufacture time and cost. One aspect of automation includes using machines to pick up components to be manufactured and processed. However, small components cannot be easily picked up by a machine. Thus, a pick-up is often temporarily attached to a small component for allowing the component to be easily picked up.

Electronic card connectors, such as a PCMCIA connector, have a slim U-shaped frame which is extremely difficult to pick up. Thus, a pick-up is usually inserted into the U-shaped frame of the connector for allowing the connector to be picked up. FIG. 1 of the attached drawings shows an example of a conventional pick-up commonly used in the connector industry. The pick-up, designated by reference numeral 6, comprises a rectangular body having a flat surface 60 for being picked up. Raised portions 61 are formed on opposite lateral edges of the pick-up 6. The pick-up 6 is received in the U-shaped frame of the connector, designated by reference numeral 7, with the lateral edges thereof received in slots 71 defined in the frame. The raised portions 61 are fittingly engaged in the corresponding slots 71 thereby securely retaining the pick-up in the connector 7. However, the fitting engagement between the pick-up 6 and the slots 71 exerts an excessive force on the U-shaped frame which may lead to severe deformation of or damage to the connector 7.

It is thus desirable to provide a pick-up for an electronic card connector which overcomes the problems encountered in the prior art.

SUMMARY OF THE INVENTION

Accordingly, an object of the present invention is to provide a pick-up for fitting into an electronic card connector for allowing the connector to be picked up without applying an excessive force thereto.

Another object of the present invention is to provide a pick-up for fitting into an electronic card connector which does not cause severe deformation of or damage to the connector.

A further object of the present invention is to provide a pick-up which can be readily fit into and removed from the connector.

To achieve the above objects, a pick-up in accordance with the present invention is adapted to be fit into an electronic card connector for allowing the connector to be picked up by an external device. The pick-up includes a flat body receivable between two spaced retention bars of the connector. The flat body has two lateral edges and a flat face extending therebetween. Each lateral edge is receivable in a guide slot defined in the corresponding retention bar for retaining the flat body in the connector with the flat face exposed for engagement with the external device. The pick-up further includes a retainer mounted on each lateral edge thereof. The retainer includes at least one cantilevered arm having a first end fixed to the lateral edge of the flat body and a free second end spaced from the lateral edge and forming a contact engagement member thereon. The contact engagement member is thus resiliently supported on the lateral edge for engaging with the guide slot to secure the pick-up in the connector.

BRIEF DESCRIPTION OF THE DRAWINGS

The present invention will be apparent to those skilled in the art by reading the following description of the preferred embodiments thereof, with reference to the accompanying drawings, in which.

DETAILED DESCRIPTION OF THE PREFERRED EMBODIMENT

Figure 1:
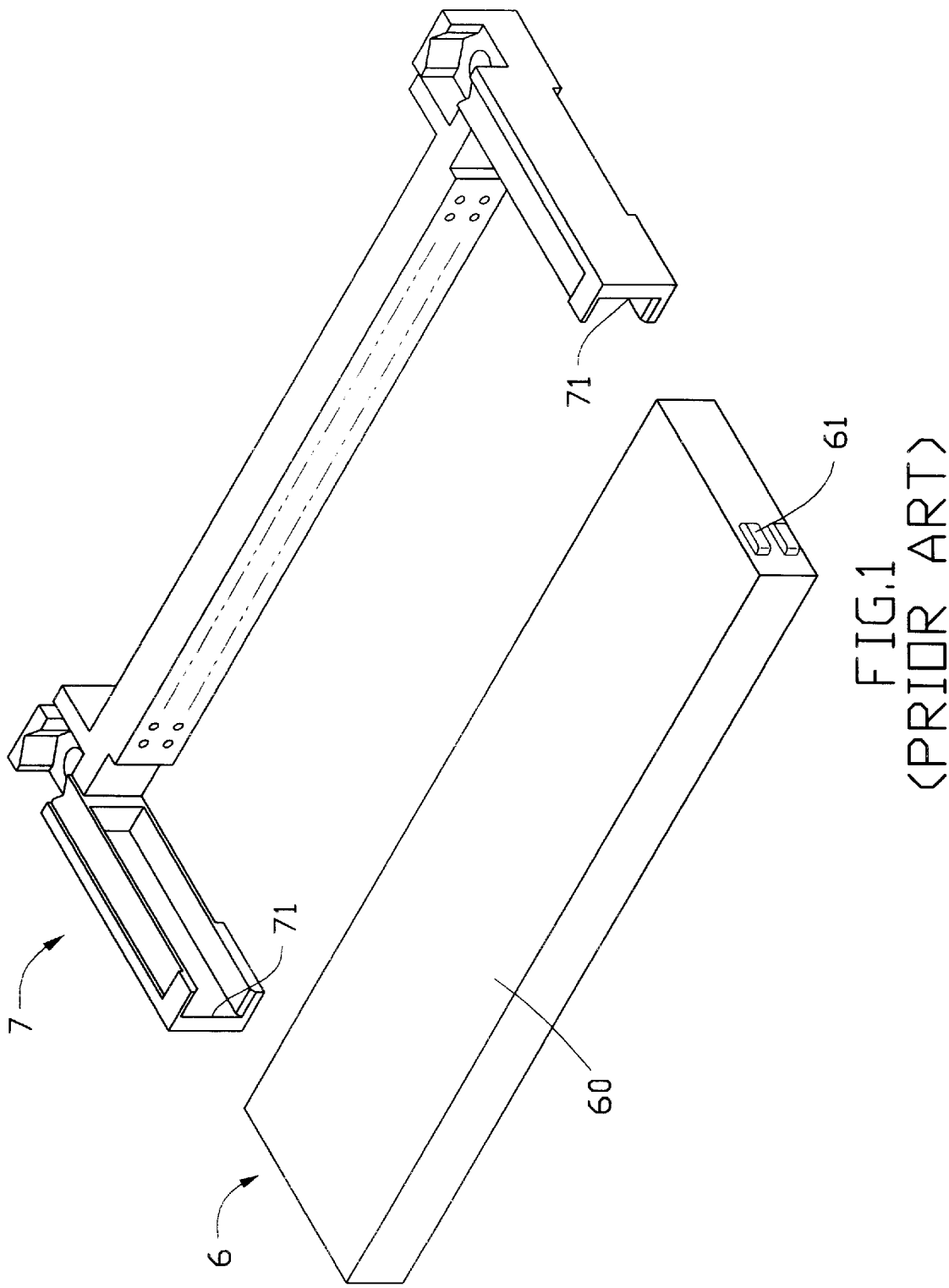
FIG. 1 is perspective view of an electronic card connector and a conventional pick-up to be fit therein.
Figure 2:
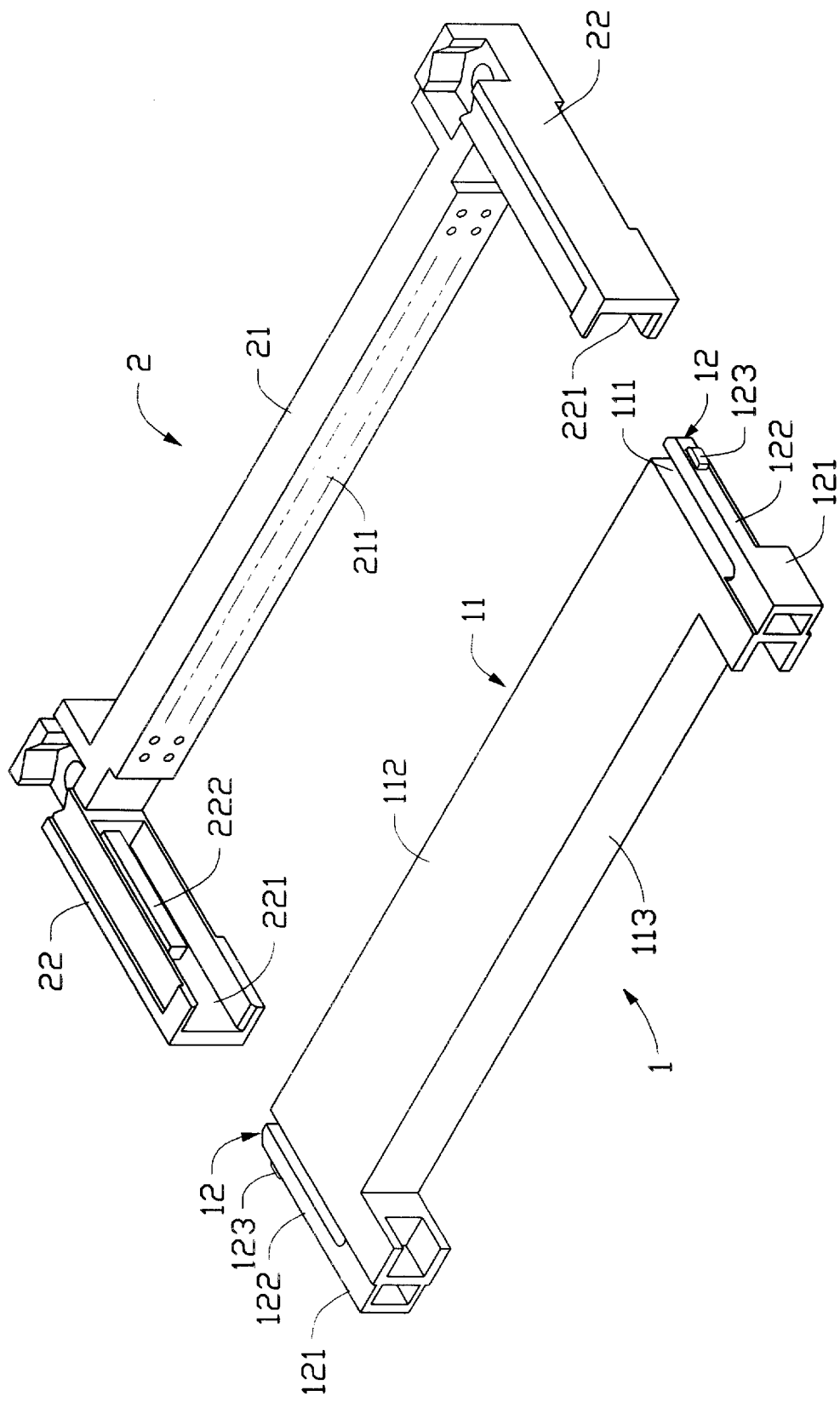
FIG. 2 is a perspective view of an electronic card connector and a pick-up in accordance with a first embodiment of the present invention to be fit therein.
Figure 3:
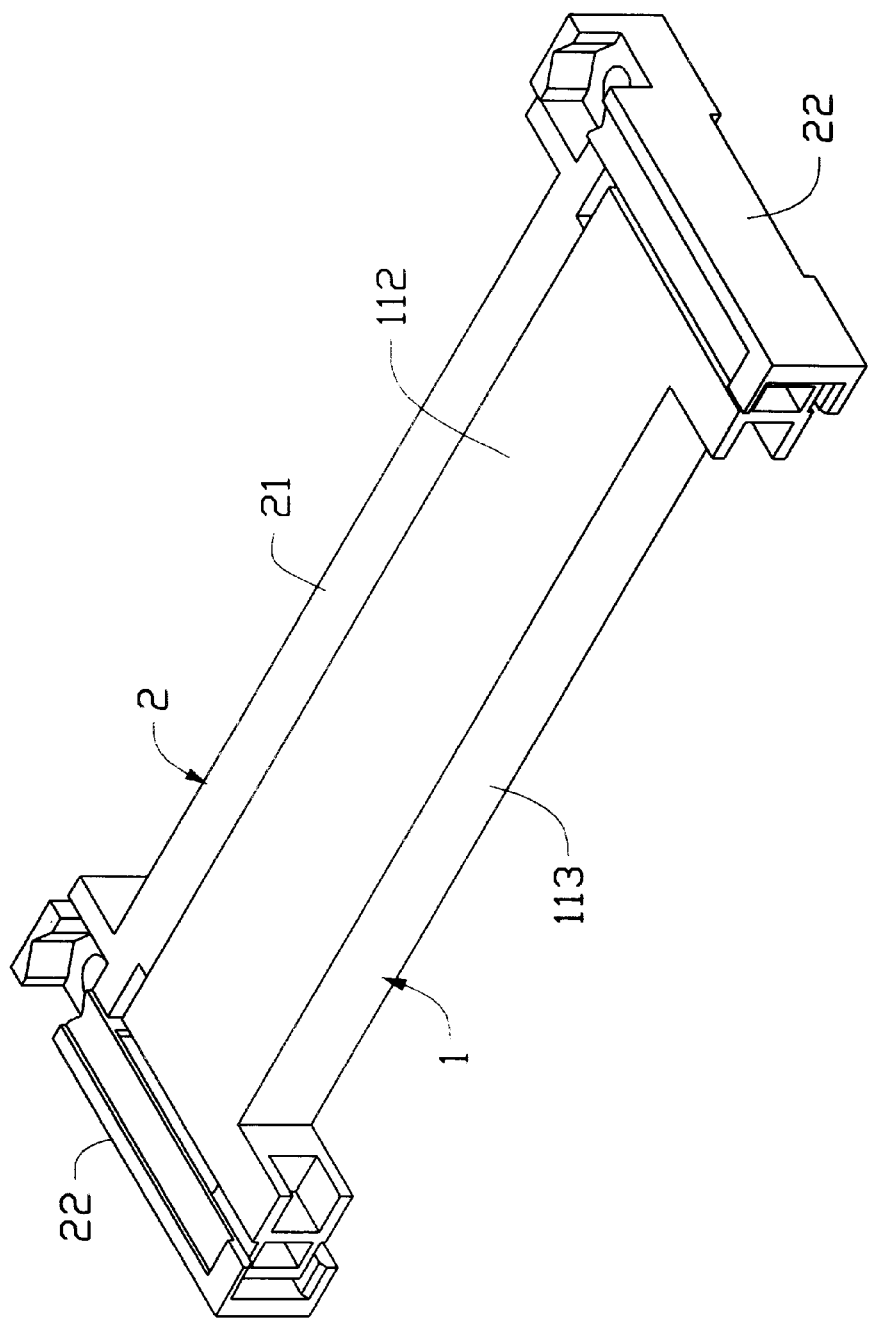
FIG. 3 is a perspective view of the pick-up of the present invention fit into the electronic card connector.

Referring to the drawings and in particular to FIGS. 2 and 3, a pick-up 1 constructed in accordance with the present invention is adapted to be fit into an electronic card connector 2 (such as a PCMCIA connector) for allowing the connector 2 to be picked up by a machine or an operator. The connector 2 comprises an insulative housing 21 forming channels 211 therein for receiving contacts (not shown) and two retention bars 22 extending from opposite ends of the insulative housing 21. Each retention bar 22 defines a guide slot 221 in an inner face thereof. A positioning rib 222 is formed in the guide slot 221.

The pick-up 1 of the present invention comprises a flat body 11 having a front edge 113 and two opposite lateral edges 111. The flat body 11 also has at least one flat face 112 adapted to be engaged by the machine or operator. Each lateral edge 111 of the flat body 11 has a retainer 12 mounted thereon.

Each retainer 12 comprises an arm 122 having a fixed end 121 attached to the lateral edge 111 and a free end forming a projection 123. The pick-up 1 is received between the two retention bars 22 of the connector 2 whereby each retainer 12 is received in the corresponding guide slot 221 and the projection 123 engages therewith. The engagement between the projection 123 of each retainer 12 and the corresponding guide slot 221 of the connector 2 secures the pick-up 1 to the connector 2.

When inserting the pick-up 1 into the connector 2, the front edge 113 of the flat body 11 receives a force for driving the pick-up 1 into the connector 2.

The arm 122, forming a cantilevered beam, is deflectable when engaging the projection 123 with the guide slot 221. The deflectability reduces the force of the projection 123 acting on the retention bar 22 thereby preventing an excessive force from being exerted on the retention bar 22 of the connector 2 and reducing the likelihood of damage from being incurred thereon.

Figure 4:
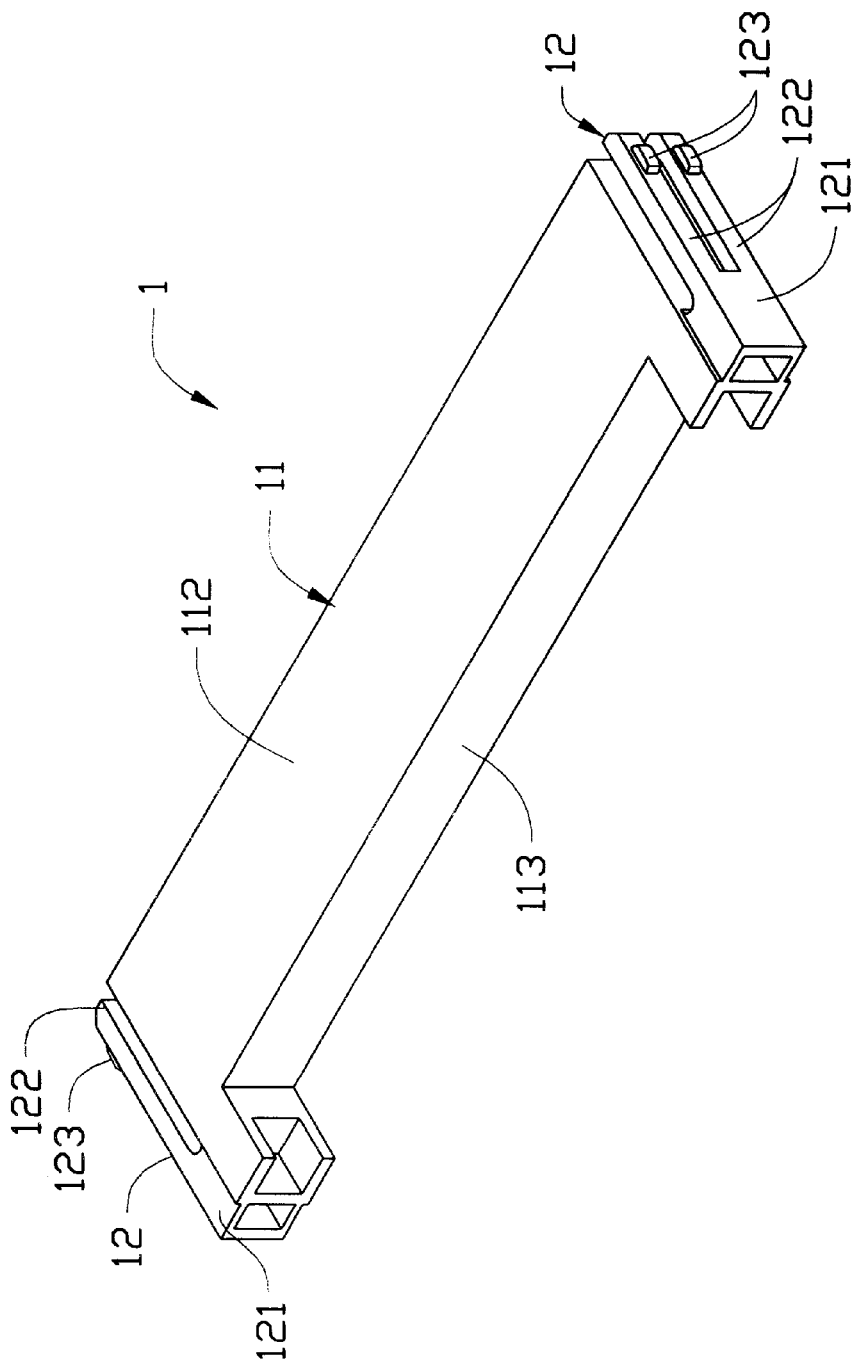
FIG. 4 is a perspective view of a pick-up in accordance with a second embodiment of the present invention.

The retainer 12 may comprise a single cantilevered arm 122 as shown in FIG. 2. Alternatively, the retainer 2 may comprise two spaced cantilevered arms 122 as shown in FIG. 4. The spacing between the arms 122 substantially corresponds to the width of the positioning rib 222 formed in the guide slot 221 for receiving the positioning rib 222 therebetween when inserting the pick-up 1 into the connector 2. Preferably, the pick-up 1 has two cantilevered arms 122 formed on at least one of the lateral edges 111 thereof.

Although the present invention has been described with reference to the preferred embodiments, it is apparent to those skilled in the art that a variety of modifications and changes that may be made without departing from the scope of the present invention which is intended to be defined by the appended claims.

What is claimed is:

1. A pick-up adapted to be fit into a connector for being picked up by an external device, the connector comprising an elongate section having two retention bars extending from opposite ends thereof, each retention bar defining a guide slot, the pick-up comprising a flat body having opposite lateral edges and a flat face extending between the lateral edges, the lateral edges being receivable in the guide slots of the retention bars for retaining the flat body therebetween, the flat face being exposed for engagement by the external device, wherein the pick-up comprises retainers mounted on opposite lateral edge thereof, each retainer comprising a contact engagement member resiliently supported on the lateral edge for engaging with the guide slot to secure the pick-up in the connector;

wherein each retainer comprises two cantilevered arms receivable in the guide post, the cantilevered arms being spaced from each other and each having a first end fixed to the lateral edge and a free second end spaced from the lateral edge, said contact engagement member being formed on the second end of the cantilevered arms, the cantilevered arms being deflectable to resiliently support the contact engagement member, the guide slot of each retention bar further forming a positioning rib therein, and said two spaced cantilevered arms receiving the positioning rib therebetween when fitting the pick-up into the connector.

2. An electrical connector assembly comprising:

a connector including an elongated section with two retention bars extending from two opposite ends thereof, each of said two retention bars defining a guide slot therein, at least one positioning rib formed within each guide slot; and a pick-up including a flat body with two opposite lateral edges on two sides for receipt within corresponding retention bars, respectively, at least one cantilevered retainer formed on each of said two opposite lateral edges, said retainer including a resilient contact engagement member formed at a free end thereof for being forwardly engaged with a corresponding positioning rib in a vertical direction.

3. A pick-up adapted to be fit into a connector for being picked up by an external device, the connector comprising an elongate section having two retention bars extending from opposite ends thereof, each retention bar defining a guide slot, the pick-up comprising a flat body having opposite lateral edges and a flat face extending between the lateral edges, the lateral edges being receivable in the guide slots of the retention bars for retaining the flat body therebetween, the flat face being exposed for engagement by the external device, wherein the pick-up comprises retainers mounted on opposite lateral edges thereof, each retainer comprising at least one deflectable cantilevered arm receivable in the guide slot, the cantilevered arm having a first end fixed to the lateral edge and a free second end spaced from the lateral edge, a contact engagement member being formed on the second end of the cantilevered arm for engaging with the guide slot to secure the pick-up in the connector;

wherein the retainer of a first one of the lateral edges of the flat body comprises one cantilevered arm and the retainer of a second one of the lateral edges of the flat body comprises two cantilevered arms, the two cantilevered arms of the second lateral edge of the flat body being spaced from each other, the guide slot of the retention bar of the connector having a positioning rib formed therein, the positioning rib being receivable between the two spaced cantilevered arms of the second lateral edge of the flat body.

\* \* \* \* \*